US007591923B2

(12) United States Patent
Mitrovic et al.

(10) Patent No.: US 7,591,923 B2
(45) Date of Patent: Sep. 22, 2009

(54) APPARATUS AND METHOD FOR USE OF OPTICAL SYSTEM WITH A PLASMA PROCESSING SYSTEM

(75) Inventors: Andrej S Mitrovic, Phoenix, AZ (US); Audunn Ludviksson, Scottsdale, AZ (US)

(73) Assignee: Tokyo Electron Limited (JP)

( * ) Notice: Subject to any disclaimer, the term of this patent is extended or adjusted under 35 U.S.C. 154(b) by 427 days.

(21) Appl. No.: 11/082,223

(22) Filed: Mar. 17, 2005

(65) Prior Publication Data

US 2005/0173375 A1 Aug. 11, 2005

Related U.S. Application Data

(63) Continuation of application No. PCT/US03/26208, filed on Aug. 21, 2003.

(60) Provisional application No. 60/414,348, filed on Sep. 30, 2002.

(51) Int. Cl.
*G01L 21/30* (2006.01)
(52) U.S. Cl. ............... 156/345.24; 216/60; 118/712
(58) Field of Classification Search .......... 118/723 MW
See application file for complete search history.

(56) References Cited

U.S. PATENT DOCUMENTS 5,322,590 A 6/1994 Koshimizu
5,482,684 A * 1/1996 Martens et al. ............ 422/119
5,679,214 A 10/1997 Kuo
5,748,297 A 5/1998 Suk et al.
5,759,424 A * 6/1998 Imatake et al. ............. 216/60
6,071,375 A * 6/2000 Chen et al. ............. 156/345.24
6,077,386 A 6/2000 Smith, Jr. et al.
6,284,049 B1 * 9/2001 Uesugi et al. ............. 118/712
6,344,151 B1 2/2002 Chen et al.
6,390,019 B1 5/2002 Grimbergen et al.
6,504,903 B1 * 1/2003 Kondo et al. ............. 378/119

FOREIGN PATENT DOCUMENTS

| JP | 61-13138 | 1/1986 |
|---|---|---|
| JP | 63-303086 | 12/1988 |
| JP | 5-259250 | 10/1993 |
| JP | 8-68754 | 3/1996 |
| JP | 9-36102 | 2/1997 |

* cited by examiner

*Primary Examiner*—Michael Cleveland
*Assistant Examiner*—Nathan K Ford

(57) ABSTRACT

A plasma processing system and method for operating an optical system in conjunction with a plasma processing system are provided. The plasma processing system includes an optical system in communication with a plasma processing chamber of the plasma processing system. The optical system has a window and is constructed and arranged to detect a plasma process condition through the window and a transmission condition of the window. The method includes detecting an optical emission from the plasma processing region and monitoring contamination of a window provided by the optical system.

24 Claims, 7 Drawing Sheets

APPARATUS AND METHOD FOR USE OF OPTICAL SYSTEM WITH A PLASMA PROCESSING SYSTEM

This is a continuation of International Application No. PCT/US03/26208, filed Aug. 21, 2003, which relies for priority upon U.S. Provisional Application No. 60/414,348, filed Sep. 30, 2002, the contents of both of which are incorporated herein by reference in their entireties.

This continuation of PCT application is also related to International Application No. PCT/US03/30051, filed Sep. 25, 2003, which relies for priority upon U.S. Provisional Application No. 60/414,349, filed Sep. 30, 2002, the contents of both of which are incorporated herein by reference in their entireties.

BACKGROUND OF THE INVENTION

1. Field of Invention

The present invention relates to plasma processing and more particularly to monitoring of the plasma processing using an optical system.

2. Description of Background Information

Typically, plasma is a collection of species, some of which are gaseous and some of which are charged. Plasmas are useful in certain processing systems for a wide variety of applications. For example, plasma processing systems are of considerable use in material processing and in the manufacture and processing of semiconductors, integrated circuits, displays and other electronic devices, both for etching and layer deposition on substrates, such as, for example, semiconductor wafers.

Optical diagnostic methods are widely used to monitor plasma processes and to determine an end point of a plasma process, for example, a plasma etching process.

Generally, conventional optical diagnostic methods use a light transmissive window to separate the plasma process chamber from the optical detection system, as the plasma process chamber must operate at low vacuum, typically a few milliTorr to a few Torr. The window tends to become coated with etch by-products that cloud the window. Although this method is widely used and has been quite successful, it is problematic when the window becomes clouded because the optical diagnostic data can be skewed and even can be rendered invalid. In addition, the window would need to be cleaned or else replaced before more product can be processed, either being an expensive and time consuming operation.

Accordingly, it would be desirable to monitor contamination of a window or a viewport for optical diagnostic methods and systems used in conventional plasma processing.

SUMMARY OF THE INVENTION

One aspect of the invention is to provide a plasma processing system in communication with an optical system. The plasma processing system comprises a chamber containing a plasma processing region, a chuck constructed and arranged to support a substrate within the chamber in the processing region and a chamber opening to enable plasma within the plasma processing region to exit the chamber. A plasma generator is positioned in communication with the chamber and is constructed and arranged to generate a plasma during a plasma process in the plasma processing region. The optical system includes a window assembly positioned in communication with the chamber opening. The optical system is constructed and arranged to detect a plasma process condition and a window transmission condition. An optical device is constructed and arranged to monitor contamination of the window.

Another aspect of the invention is to provide a method for operating an optical system in communication with a plasma processing system. The plasma processing system has a chamber containing a plasma processing region in which a plasma can be generated during a plasma process, and the optical system. The optical system is optically coupled to the plasma processing region. The method comprises detecting an optical emission from the plasma processing region through a window provided by the optical system and monitoring contamination of a window provided by the window assembly. A method can further be provided to monitor contamination of a window positioned between the optical system and the plasma processing system in real time.

Yet another aspect of the invention is to provide an optical system for a plasma processing system. The optical system comprises a signal collection portion constructed and arranged to detect a plasma process condition and a window transmission condition. The signal collection portion has a window capable of receiving an optical emission from the plasma processing region. An optical device is constructed and arranged to monitor contamination of the window.

These and other aspects will be achieved by the invention wherein the contamination of the window between the plasma processing chamber and the optical system is monitored. Further, these and other aspects and features of the invention will become apparent from the following detailed description considered in conjunction with the accompanying drawings. It is to be understood, however, that the drawings are for the purpose of illustration only, and not as a definition of the limits or principles of the invention.

BRIEF DESCRIPTION OF THE DRAWINGS

The accompanying drawings, which are incorporated in and constitute a part of the specification, embodiments of the invention, and together with the general description given above and the detailed description of the embodiments given below, serve to explain the principles of the invention wherein.

DETAILED DESCRIPTION OF EMBODIMENTS

Figure 1:
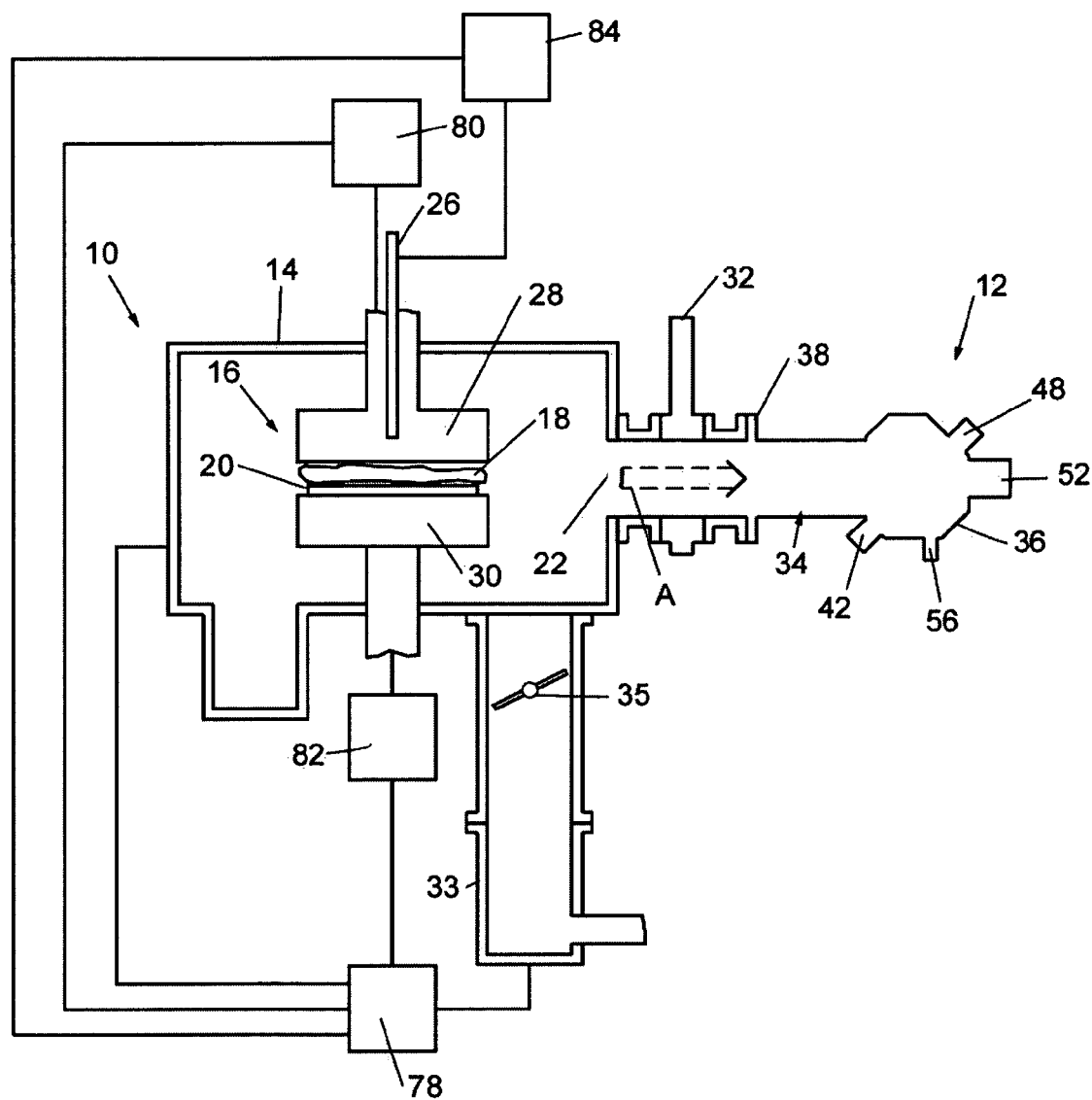
FIG. 1 is a diagrammatic cross section of an embodiment of a plasma processing system in accordance with principles of the invention, showing a plasma processing chamber in communication with an optical system including a window mounted within a signal collection portion of the optical system.

FIG. 1 shows an embodiment of a plasma processing system according to principles of the invention. The plasma processing system, generally indicated at 10, is in communication with an optical system, generally indicated at 12.

The plasma processing system 10 comprises a plasma process chamber, generally indicated at 14, that defines a plasma processing region 16 in which a plasma 18 can be generated. A chuck or electrode 30 can be positioned in the chamber 14 and is constructed and arranged to support a substrate 20, which may be a semiconductor wafer, for example, within the chamber 14 in the processing region 16. The substrate 20 can be a semiconductor wafer, integrated circuit, a sheet of a polymer material to be coated, a metal to be surface hardened by ion implantation, or some other semiconductor material to be etched or deposited, for example.

Although not shown, coolant can be supplied to the chuck 30, for example, through cooling supply passages coupled to the chamber 14. Each cooling supply passage can be coupled to a cooling supply source. For example, the cooling supply passages can be individually connected to the cooling supply source. Alternatively, cooling supply passages can be interconnected by a network of interconnecting passages, which connect all cooling supply passages in some pattern.

Generally, plasma generation gas, which can be any gas that is ionizable to produce a plasma, is introduced into the chamber 14 to be made into a plasma, for example, through a gas inlet 26. The plasma generation gas can be selected according to the desired application as understood by one skilled in the art and can be nitrogen, xenon, argon, carbon tetrafluoride ($CF_4$) or octafluorocyclobutane ($C_4F_8$) for fluorocarbon chemistries, chlorine ($Cl_2$), hydrogen bromide (HBr), or oxygen ($O_2$), for example.

The gas inlet 26 is coupled to the chamber 14 and is configured to introduce plasma processing gases into the plasma processing region 16. A plasma generator in the form of upper electrode 28 and lower electrode (or chuck) 30 may be coupled to the chamber 14 to generate the plasma 18 within the plasma processing region 16 by ionizing the plasma processing gases. The plasma processing gases can be ionized by supplying RF and/or DC power thereto, for example, with power supplies 80, 82 coupled to the upper electrode 28 and the lower electrode 30, respectively. In some applications, the plasma generator may be an antenna or RF coil capable of supplying RF power, for example.

A variety of gas inlets or injectors and various gas injecting operations can be used to introduce plasma processing gases into the plasma processing chamber 14, which can be hermetically sealed and can be formed from aluminum or another suitable material. The plasma processing gases are often introduced from gas injectors or inlets located adjacent to or opposite from the substrate. For example, as shown in FIG. 1, gases supplied through the gas inlet 26 can be injected through an inject electrode (upper electrode 28) opposite the substrate in a capacitively coupled plasma (CCP) source. The gases supplied through the gas inlet 26 can be controlled with a gas flow control system 84. The power supplied to the plasma, by power supplies 80, 82, for example, can ignite a discharge with the plasma generation gas introduced into the chamber 14, thus generating a plasma, such as plasma 18.

Alternatively, in embodiments not shown, the gases can be injected through a dielectric window opposite the substrate in a transformer coupled plasma (TCP) source. Other gas injector arrangements are known to those skilled in the art and can be employed in conjunction with the plasma processing chamber 14.

The plasma process chamber 14 is fitted with an outlet having a vacuum pump 33 and a valve 35, such as a throttle control valve, to provide gas pressure control in the plasma process chamber 14.

Various leads (not shown), for example, voltage probes or other sensors, can be coupled to the plasma processing system 10.

An opening 22 extends radially from the process chamber 14 to the optical system 12. The optical system 12 is generally vacuum tight and can be formed in communication with the process chamber 14 to enable optical emission from the plasma 18 to be transmitted to the optical system 12, as will be described in further detail below. Alternatively, the optical system 12 can be positioned in other positions as well, such as above or below the process chamber 14, for example, depending on the location of the plasma where one or more measurements are needed.

A gate valve 32 may be fastened to the plasma process chamber 14, adjacent to the chamber opening 22 and between the plasma process chamber 14 and the optical system 12, with suitable fasteners. The gate valve 32 can be provided to allow isolation of the optical system 12 from the plasma processing chamber 14 for maintenance operations, such as cleaning or replacing the optical system 12 or periods of gas purge, for example. However, the gate valve 32 is not essential to the invention and may be omitted in an alternative embodiment. For example, the gate valve 32 may be provided or eliminated from the system 10 depending on the plasma process being performed by the system 10.

Figure 2:
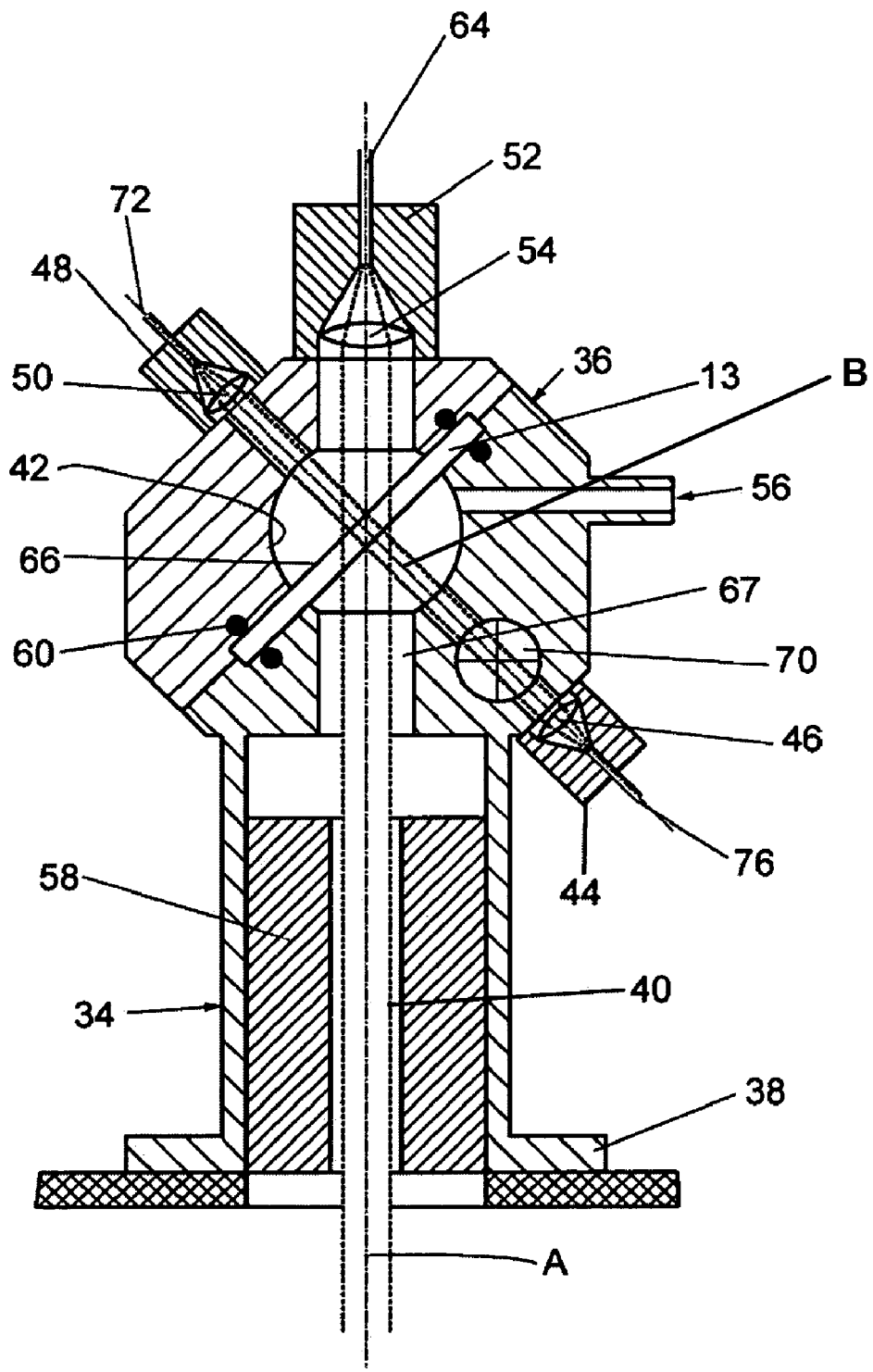
FIG. 2 is a diagrammatic cross section of the signal collection portion shown in FIG. 1.

As shown in FIG. 2, the optical system 12 includes a tubular mounting portion or spacer 34, which may be of circular cross section, and a signal collection portion 36 attached to it. The mounting portion or spacer 34 of the optical system 12 can be coupled to the plasma process chamber 14 by a mounting flange 38 thereof. Fasteners (not shown), such as nuts and bolts or screws, for example, can extend through the mounting flange 38 to couple the mounting flange 38 to the plasma process chamber 14.

The signal collection portion 36 can include an open area 42 formed in a central portion thereof and configured to receive a window or viewport 13 therein. The signal collection portion 36 is constructed and arranged to monitor contamination of the window or the viewport 13, as will be described in greater detail below. Alternatively, as described below in relation to FIG. 6, the window 13 within the signal collection portion can be positioned to eliminate the open area 42.

A transmission input lens housing 44 for housing a transmission input lens 46 and a transmission output lens housing 48 for housing a transmission output lens 50 are integrally formed with the signal collection portion 36. The transmission input lens housing 44 and the transmission output lens housing 48 can be positioned in optical communication on opposite sides of the open area 42 and the window 13, as will be described below in greater detail. A plasma emission signal collection lens housing 52 can be integrally formed with the signal collection portion 36 to be aligned axially with incoming light (shown by the arrow A in FIG. 1). That way, the signal collection lens housing 52 can house a signal collection lens 54 that is configured to receive light emerging from the window 13, as will be described below in greater detail.

The signal collection portion 36 may also include a gas purge passageway 56 integrally formed therewith to communicate with the open area 42. The gas purge passageway 56 allows a purge gas to be provided, for example, in plasma processes involving aggressive chemistry. Aggressive chemistries can include those chemistries that have a greater tendency of coating the window with deposits, such as chemistries rich in fluorocarbon gases like $CF_4$ and $C_4F_8$.

Alternatively, the transmission input lens housing 44, the transmission output lens housing 48, the signal collection lens housing 52 and the gas purge passageway 56 may be coupled to the signal collection portion 36 by fasteners, e.g., nuts and bolts, screws or other suitable fasteners.

A flow restrictor element 58 can be mounted within the mounting portion or spacer 34 of the optical system 12, by adhesive, bonding material, using suitable fasteners, or by simple insertion in a tight fit arrangement with the portion or spacer 34, to determine the amount of light and process gas that reaches the window 13 through a flow restrictor duct 40. Alternatively, the flow restrictor element 58 can be integrally formed with the mounting portion or spacer 34 and the flow restrictor duct 40 can be machined directly in the mounting portion or spacer 34. In plasma processes where plasma spectra do not need to be measured often or in non-aggressive chemistries, for example, a shutter valve (not shown) may be provided in addition to or in place of flow restrictor element 58. The shutter valve can be implemented to reduce contamination of window 13 and one or more lens(es) positioned within the signal collection portion 36, for example, the transmission input lens 46. Because the transmission output lens 50 is on the "clean" side of window 13, or on an opposite side as the transmission input lens 46, the transmission output lens 50 is protected from contamination.

The window 13 can be mounted in the signal collection portion 36 by appropriate mounting elements 60, such as vacuum seals, o-ring seals or clamps, for example so that at least a portion of the window 13 extends through the open area 42. The window 13 can be mounted in the open area 42 at an angle to the incoming light beam A, but the window 13 may also be mounted perpendicular to the incoming light (shown by the arrow A in FIG. 1), for example, if the window 13 is mounted directly to an end of the flow restrictor element 58.

Figure 3:
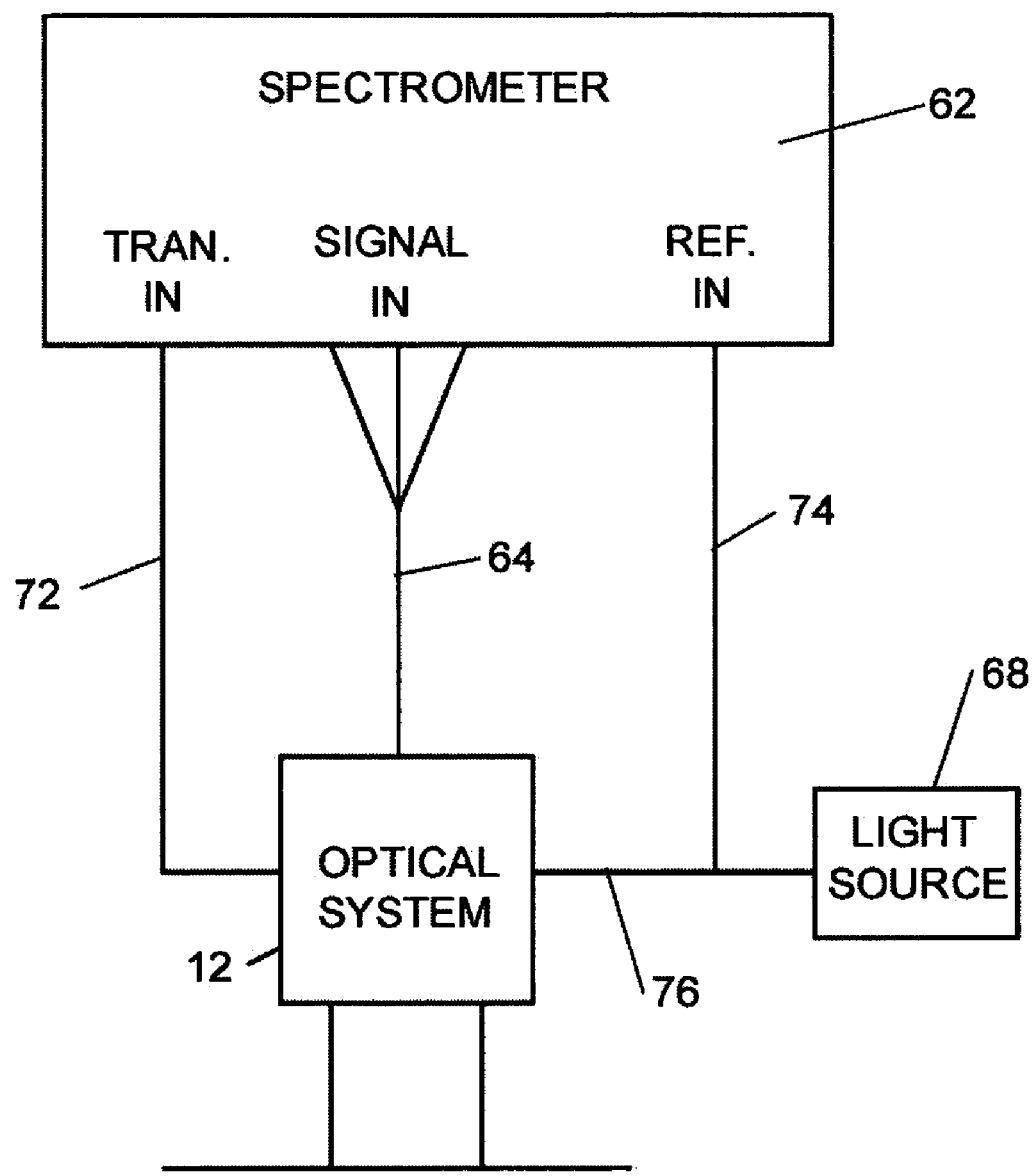
FIG. 3 is a schematic view of the optical system shown in FIG. 2 communicating with an optical device, such as a spectrometer.

The angled positioning of the window 13 allows incoming light to be refracted through the window 13 and allows the incoming light to emerge from the window 13 in the same direction in which it came from the plasma processing region 16. The thickness of the window 13 may offset the direction of light emerging from the window 13 with respect to the direction of incoming light, but the signal collection lens 54 can be positioned within the signal collection lens housing 52 to compensate for this offsetting relationship. The signal collection lens 54 can be coupled to an optical emission spectroscopy system, shown by example in the form of spectrometer 62, by a fiber optic cable 64 (FIG. 3). The fiber optic cable 64 is coupled to the main input (SIGNAL IN) of the spectrometer 62 to transmit plasma emission thereto.

The size of the flow restrictor element 58 not only determines the amount of light or gas that reaches the window 13, but also can create a higher pressure of purge gas passed through the open area 42 due to reduced flow conductance. In plasma processes that do not involve aggressive chemistry, the gas purge passageway 56 and the flow restrictor element 58 may be eliminated from the signal collection portion 36 of optical system 12. This is because contamination of the window 13 is greater in processes which involve aggressive chemistry, and with non-aggressive chemistry flow restriction or purging with a purge gas may not be needed.

The transmission input lens 46 and the transmission output lens 50 constitute a transmission detector system, which is constructed and arranged to detect a window transmission condition, e.g., contamination collected on the window 13. The transmission input lens 46 is configured to transmit light from a light source 68 (FIG. 3) through the window 13 and the transmission output lens 50 is configured to receive the light from window 13 for detecting the window transmission condition. The light transmitted from transmission input lens 46 to transmission output lens 50 forms the transmission detection beam B (shown in FIG. 2 and FIG. 6), the beam being indicated with dotted lines.

As shown in FIG. 2, the transmission input lens 46 and the transmission output lens 50 are arranged at about a 45° angle with respect to the incoming light to reduce interference between the transmission detector system and the incoming light beam A. The transmission input lens 46 and the transmission output lens 50 can be arranged at other angles as well, such that the light transmitted through the window 13 from the transmission input lens 46 can be angled, e.g., at an angle less than 90°, with respect to the optical transmission from the plasma processing region 16. Optical baffles 66, 67 can be provided in the open area 42 and surrounding the incoming light beam A to further reduce such interference. To further reduce stray reflections, the entire inner volume of the signal collection portion 36 may have a flat black finish applied thereto which is compatible with the process chemistry. A shutter valve 70 may be positioned between the transmission input lens 46 and the window 13 in optical communication therewith. The shutter valve 70 can protect the transmission input lens 46 from contamination when not being used to make window transmission measurements. A cavity between the transmission input lens 46 and the shutter valve 70 may be gas purged to further protect the transmission input lens 46 from contamination. For example, the gas purge passageway 56 can include a passageway extending therefrom that connects to the cavity between the transmission input lens 46 and the shutter valve 70.

During the plasma process, film deposition on window 13 is generally slow. Thus, transmission measurements generally do not have to be made more often than every 10 to 20 seconds, for example. Typical transmission measurement times via the spectrometer 62 are less then a few tens of milliseconds long, thus allowing the valve 70 to be kept closed for all remaining time between successive window transmission measurements, thereby protecting the transmission input lens 46 from contamination by process gas. With the transmission measurement system operated in this pulsed manner, and with purge gas supplied from gas inlet 56 to the passageway between the transmission input lens 46 and the valve 70, the transmission input lens 46 will resist replacement for very long periods of time. This allows cleaning(s) and replacement(s) of the window 13 to be reduced.

FIGS. 2 and 3 show the transmission output lens 50 being capable of communicating the window transmission condition to an optical device in the form of a spectrometer 62 external to the window assembly 12 through a fiber optic cable 72, for example. Light transmitted to an input channel (TRAN IN) of the spectrometer 62 via fiber optic cable 72 corresponds to a transmission signal, which is representative of light having a certain intensity after passing through the window 13. The spectrometer 62 disperses light transmitted thereto into a spectrum being measured, for example with a photomultiplier tube, a CCD, or other solid state detector. Multiple channels of the spectrometer 62 may be used to widen the spectral coverage of such measurements.

FIG. 3 shows the optical system 12, the light source 68 and the spectrometer 62 in greater detail. As illustrated, two fiber optic cables 74, 76 transmit light from the light source 68 to the spectrometer 62 and the optical system 12, respectively. Light is transmitted to an input channel (REF IN) of the spectrometer 62 via fiber optical cable 74 and is used by the spectrometer 62 as a reference or baseline signal corresponding to the light source emission, e.g., intensity, over all wavelengths. This reference or baseline signal is representative of light having a first intensity prior to passing through the window 13. The fiber optic cable 76 transmits light from the light source 68 to the transmission input lens 46 of the optical system 12.

The optical communication system 12 may be provided without the optical fibers 64, 72, and 76. For example, the optical communication system 12 may be mounted on an optical bench so that each of the transmission input lens 46, the transmission output lens 50 and the signal collection lens 54 can directly focus the optical signal to a its respective detector or from its respective light source.

The spectrometer 62 can be incorporated in a plasma process detector system to detect a plasma process condition based on the optical emission, e.g, light, from the plasma 18. Specifically, the fiber optic cable 64 can be coupled, for example, to the main input (SIGNAL IN) of the spectrometer 62. The detector system can use a photomultiplier tube, a CCD or other solid state detector to at least partially detect the plasma process condition, such as an endpoint of a plasma process, for example. However, other optical devices capable of analyzing an optical signal may be used as well. The plasma process optical detector system may be incorporated into the spectrometer 62, or may be separate from it.

A controller 78 capable of generating control voltages sufficient to communicate and activate inputs to plasma processing system 10 as well as capable of monitoring outputs from the plasma processing system 10 can be coupled to the plasma processing system 14. For example, the controller 78 can be coupled to and can exchange information with the RF power supplies 80, 82 of the upper electrode 28 and the lower electrode 30, respectively, and the gas flow control system 84 in fluid communication with gas inlet 26. The controller 78 can further be in communication with the pumping system 33 and gate valve 35, respectively, although not shown in FIG. 1. A program, which can be stored in a memory, may be utilized to control the aforementioned components of plasma processing system 10 according to a stored process recipe. Furthermore, controller 78 is capable of controlling the components of the optical system 12. For example, the controller 78 can be configured to control one or more of the gate valve 32, the transmission detector system 66 and the spectrometer 62. Alternatively, multiple controllers 78 can be provided, each of which being configured to control different components of either the plasma processing system 10 or the optical system 12, for example. One example of the controller 78 is an embeddable PC computer type PC/104 from Micro/SYS of Glendale, Calif.

The spectrometer 62, when properly calibrated, is capable of calculating a transmission coefficient of the window 13 through software or a program stored in a memory. The software or program may also be capable of driving the spectrometer 62, calculating the light intensity ratio and displaying the results on a display.

The transmission coefficient corresponds to a percentage of light transmitted through window 13. A transmission coefficient can be calculated by dividing the light intensity provided in the transmission signal carried to the spectrometer 62 by fiber optical cable 72 by the light intensity provided in the reference signal carried to the spectrometer 62 by the fiber optic cable 74. The transmission coefficient evaluated at different wavelengths can then be used to monitor contamination of the window 13.

The transmission coefficient calculated for all wavelengths can be used to correct plasma emissions on the main input (SIGNAL IN) of the spectrometer 62. This can be accomplished by dividing all acquired spectral intensities in the SIGNAL IN input of the spectrometer 62 by the transmission coefficient determined for a desired wavelength. For example, if the window 13 transmits only 50% of incoming light at a certain wavelength, the transmission coefficient can be calculated to be 0.5. Using the transmission coefficient of 0.5, the measured intensity can be divided by the transmission coefficient, which in this example, would yield an intensity twice as large as the result. The calculated or yielded intensity would equal the "true" intensity, or the intensity of the plasma emission before passing through window 13.

Because the input channels (TRAN IN), (SIGNAL IN) and (REF IN) of the spectrometer 62 can constantly receive input during operation of the system 10, the window transmission correction of all acquired plasma emissions can be performed in real time, thus allowing a better and more cost-productive yield.

Figure 4:
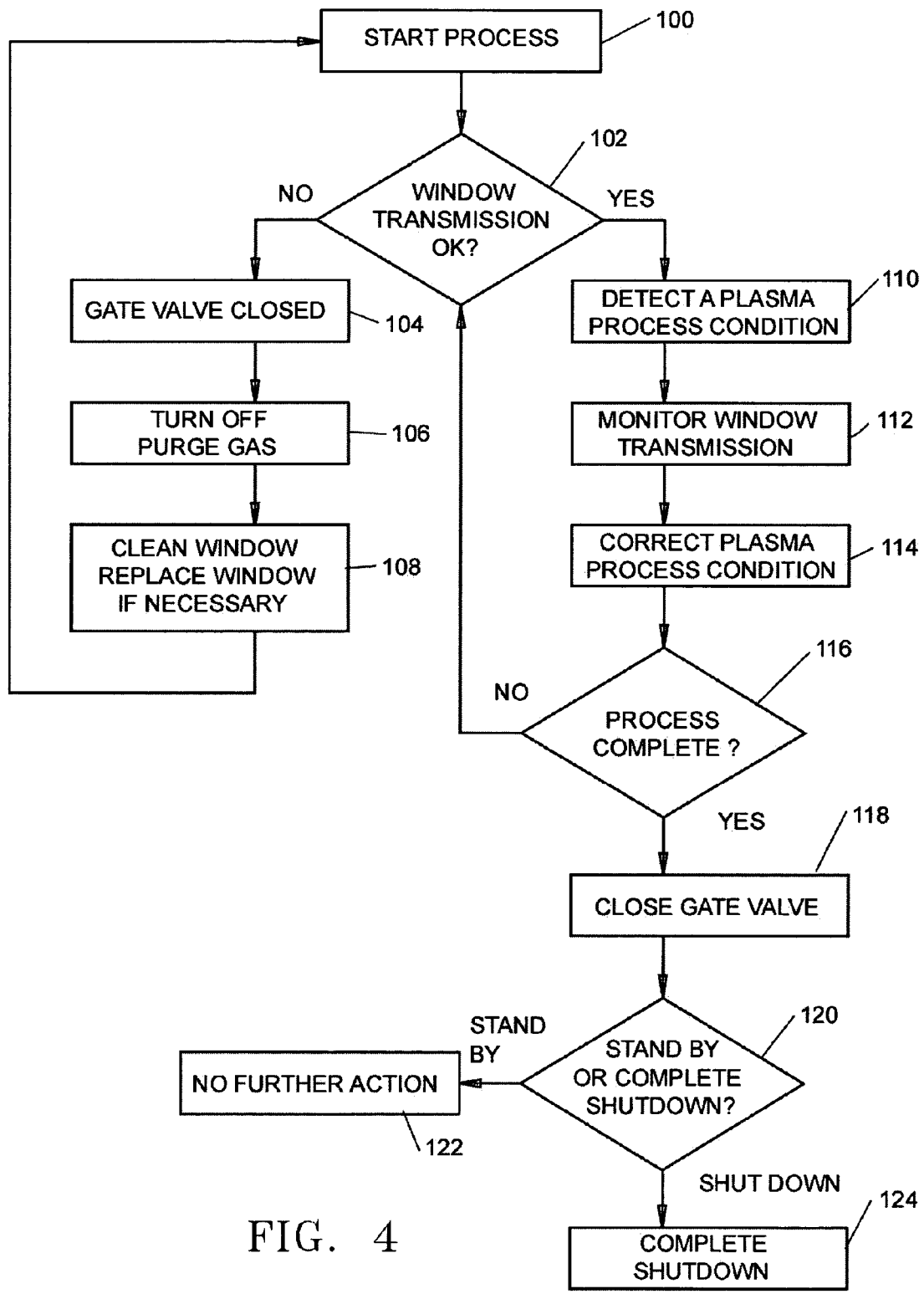
FIG. 4 is a flow chart for the operation of an optical system.

FIG. 4 shows a flow diagram that illustrates the operation of the optical system 12, which is described above with reference to FIGS. 1-3. The optical system 12 can be used when monitoring a plasma process such as plasma etching to detect, for example, an endpoint of the plasma process.

At 100, the monitoring process begins by opening the gate valve 32. At 102, a determination is made whether the transmission through window 13 is proper or desired. The determination is made by inspecting the last measured window transmission coefficient and determining if window cleaning or replacement is required, which is typically indicated by a transmission coefficient lower than a certain predetermined threshold value. The threshold value can be selected so that the measured signal is distinguishable from noise. This selection can be dependent on the frequency dependent absorption characteristics of contaminants or deposits and the spectral lines of interest, e.g., strength of the spectral lines. If not, then commands to close the gate valve 32 and turn off the purge gas are given at 104, 106 respectively. At 108, the window is cleaned, or replaced if necessary. The process then starts again at 100, and again a determination is made whether the transmission through the window 13 is proper or desired, at 102. Cleaning and replacement of the window 13 is expected to be required far less often than in typical optical diagnostic windows, because all measurements for window contamination can be corrected.

If the transmission through the window 13 is proper or desired, then a plasma process condition is detected, as necessary at 110. At 112, the system 10 measures the transmission through window 13 if a sufficiently long time has elapsed since the last measurement. At 114, the plasma process condition measurement is corrected, as necessary, based on the last-measured window transmission condition. At 116, a determination is made whether the plasma process is complete. If not, the process returns to 102, at which a determination is made whether the transmission through the window 13 is proper or desired. If the process is complete, a command to close the gate valve 32 is given at 118. As mentioned before, film deposition proceeds slowly, so that transmission measurements need not be made during every cycle. In other words, the process may close the gate valve at 118 after the determination is made at 102.

Since window measurements are generally taken every 10 or 20 seconds, while plasma emission measurements will be done many times a second, the last measured window transmission is used since film deposition on the window proceeds slowly. It is also possible to do window transmission measurements between wafers, and use the last measurement to correct all plasma emission measurement for the entire single wafer process.

At 120, a determination is made whether the system is to be put on stand-by for processing the next wafer, or to be completely shut down. If the system is to be put on standby, as shown at 122, no further action is taken, and the process returns to 100 where the process is started again. However, if the system is to be completely shut down, appropriate action is taken at 124.

Figure 5:
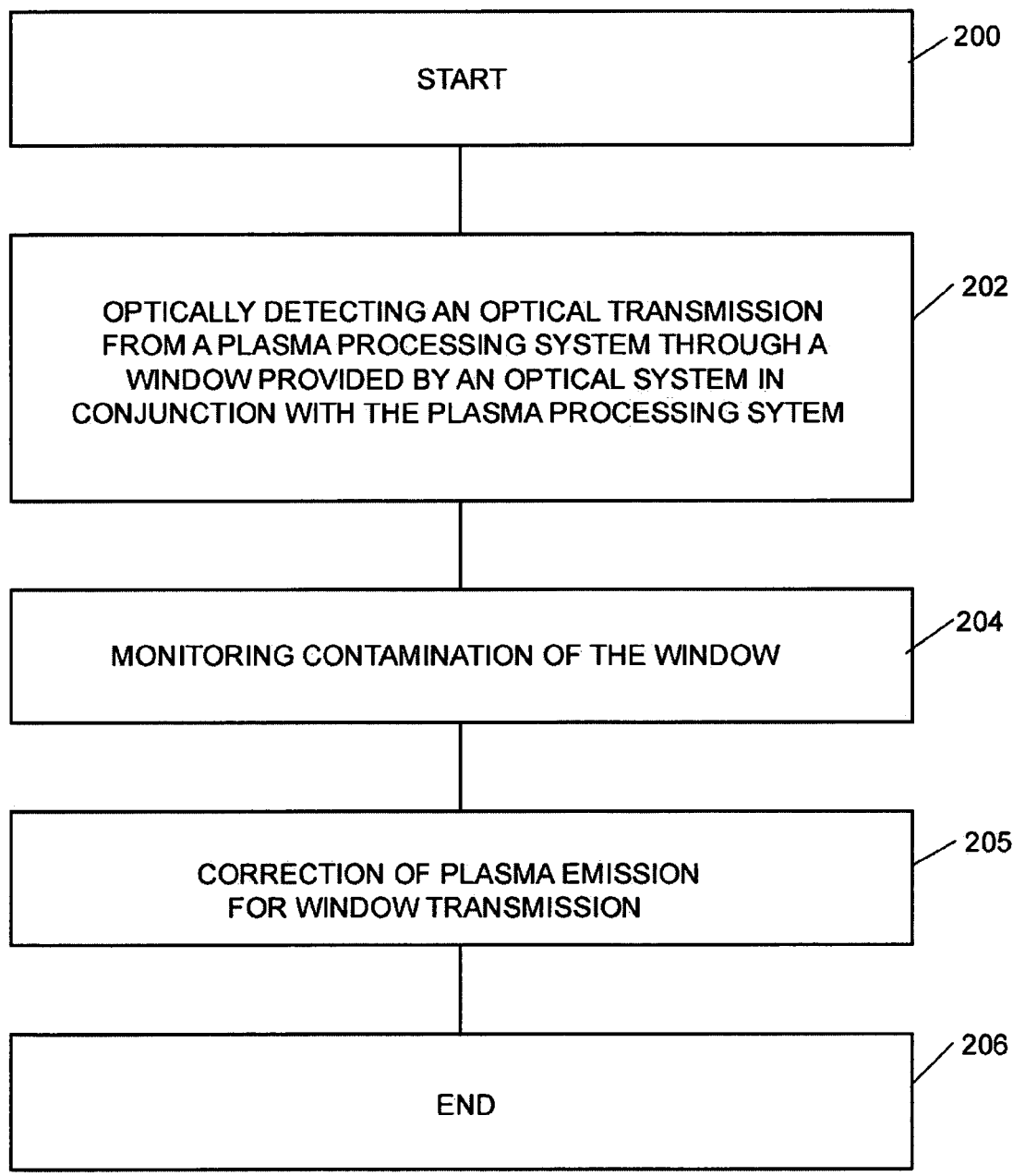
FIG. 5 is a flow chart showing a method of operating an optical system in communication with a plasma processing system in accordance with the principles of the invention.

FIG. 5 shows a method in accordance with principles of the invention. The method is for operating an optical system in conjunction with a plasma processing system. The plasma processing system has a chamber containing a plasma processing region in which a plasma can be generated during a plasma process and the optical system is optically coupled to the plasma processing region.

The method starts at 200. At 202, an optical emission from a plasma processing system is detected through a window provided by an optical system capable of receiving an optical emission, e.g., light, from the plasma processing region. For example, a plasma processing condition, such as an endpoint of the plasma process may be detected using the optical system. At 204, contamination of the window is monitored. To monitor contamination, a reference signal representative of light having a first intensity prior to passing through the window of the optical system and a transmission signal representative of light having a second intensity after passing through the window of the optical system are detected. Then, a light intensity ratio can be obtained by dividing the second intensity by the first intensity. The transmission coefficient corresponds to a percentage of light transmitted through the window, and is used to correct the measured plasma emission and thus the plasma processing condition at 205. This corrected plasma processing condition is further used as an input for tool control system action, such as for example, stopping the process once process endpoint is reached. The monitoring can be done in situ, or in real time. At 206, the method ends.

The method may comprise additional acts, operations or procedures, such as, for example, supplying a purge gas to the optical system or monitoring the window transmission condition in real time.

The plasma processing system and method described above in accordance with the invention may be advantageously used to monitor plasma conditions in real time. The plasma processing system and method provide real time monitoring of a window subject to coating and clouding (contamination), which can degrade the quality of plasma processing condition data resulting in yield loss, and unnecessary downtime and spare part costs resulting from cleaning or replacing of the window prematurely.

While the present invention has been particularly shown and described with reference to the preferred embodiments thereof, it will be understood by those skilled in the art that various changes in form and details may be made therein without departing from the spirit and scope of the invention.

For example, alternate configurations of the plasma processing system 10 are possible, and the application of the system 10 is not limited to plasma emission spectroscopy only.

Figure 6:
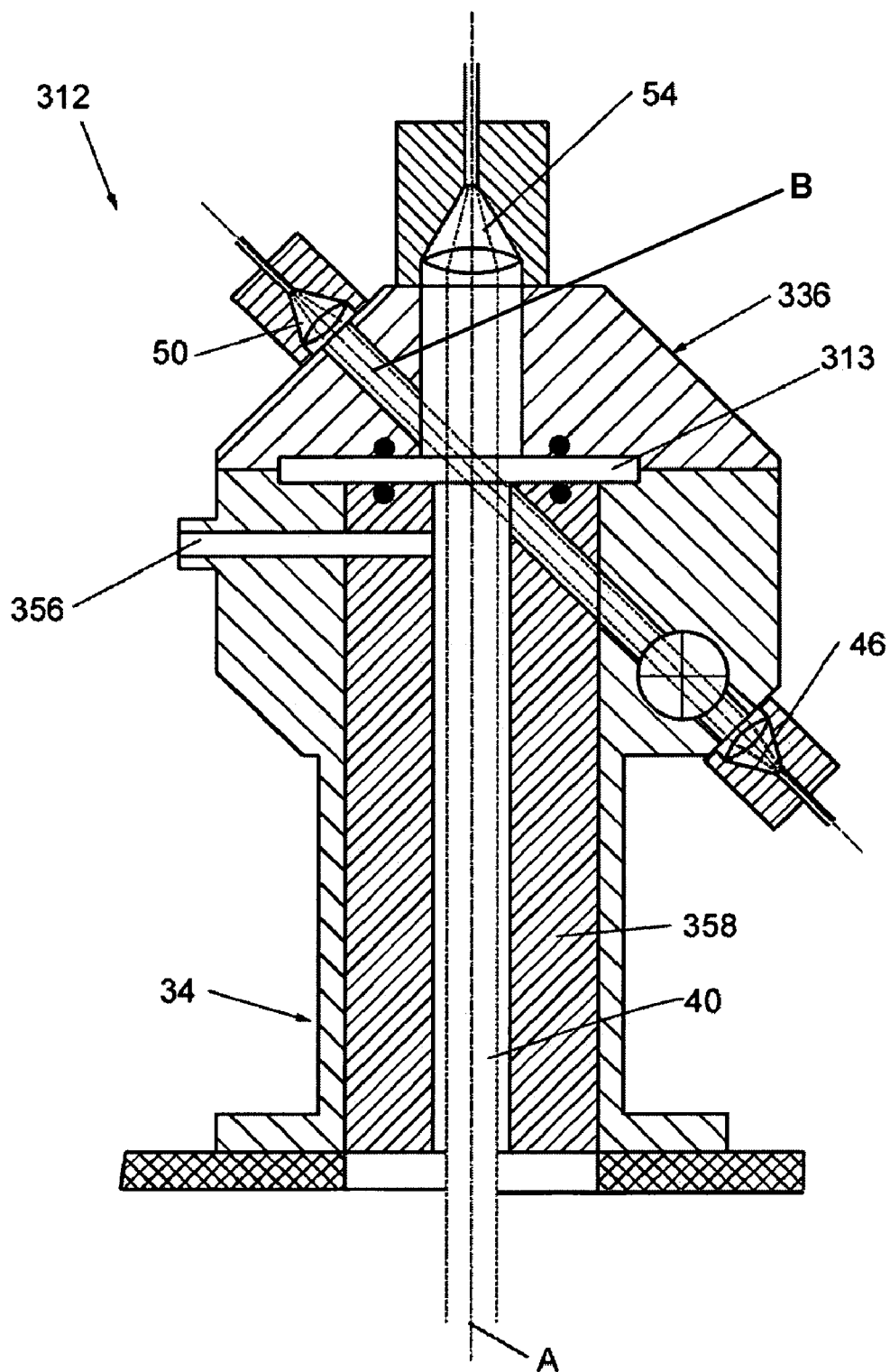
FIG. 6 is an alternate embodiment of the signal collection portion.

FIG. 6 shows an optical system 312, which is an alternate embodiment of optical system 12. As illustrated, the optical system includes the mounting portion 34 and a signal collection portion 336. In this embodiment, the transmission input lens 46 is mounted on the mounting portion 34 and the transmission output lens 50 is mounted on the signal collection portion, but operate in the same manner described above with respect to FIG. 2.

The window 313 is sealingly coupled to an end face of flow restrictor element 358 within the signal collection portion 336, thus eliminating the open area 42 of the optical system 12 shown in FIG. 2. Purge gas inlet 356 is routed to exit into the flow restrictor duct 40, as are the optical signal passageways from the transmission input lens 46, the transmission output lens 50 and the signal collection lens 54. The optical system 312 can reduce vacuum pumpdown time due to a smaller vacuum volume connected to the chamber 14, and allows for less stray reflections, which may degrade the measured signal(s). The window 313 of the optical system 312 is mounted perpendicularly to the plasma emission light beam A, with the transmission measurement beam (between the transmission input lens 46 and the transmission output lens 50) being passed at an oblique incidence angle through the window 313.

The flow restrictor 358 can be integrally formed with the mounting portion 34 and the flow restrictor duct 40 can be formed in the mounting portion 34, e.g., by machining the flow restrictor duct 40 into the mounting portion 34.

In either the optical system 12 shown in FIG. 2 or the optical system 312 shown in FIG. 6, the mounting portion 34 can be manufactured to be a selected length and to form a selected diameter of the flow restrictor duct 40. The ratio of the selected length and the selected diameter of the flow restrictor duct 40 can be selected to reduce contamination of the respective optical system, e.g., the window in the optical system. Additional, or in the alternative, to selecting the length to diameter ratio of the flow restrictor duct 40, a magnetic field, an electric field or a temperature controlled system may be operatively provided to the flow restrictor duct 40 to reduce contamination of the respective optical system. Such alternative embodiments are disclosed in co-related International Patent Application No. PCT/US03/26208 of Ludviksson et al., mentioned above.

Figure 7:
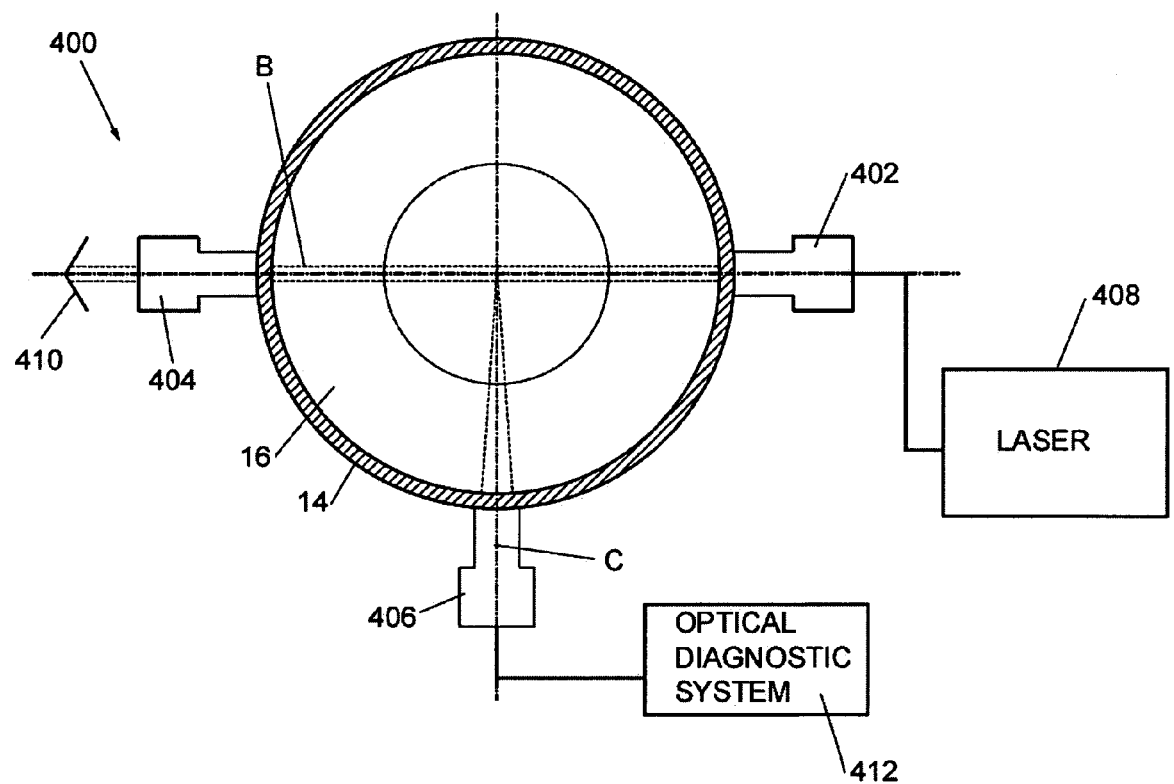
FIG. 7 is an alternate embodiment of the optical system.

FIG. 7 shows a system 400 for laser-induced plasma diagnostics incorporating three optical systems 402, 404, 406 mounted on an exterior wall of the chamber 14. Two optical systems, for example, optical systems 402, 404, can be used to pass the laser beam from laser 408 into and out of the process processing region 16 formed by the chamber 14, and on to beam dump 410 where the laser beam is absorbed. The laser excites plasma emissions along its beam path (shown by the line B) across the process processing region 16, and an additional optical system, for example, optical system 406, mounted transverse with respect to the beam B is used to acquired the laser-excited plasma emission (shown by the line C). The optical system 406 can be configured like optical system 12 in FIG. 2 or optical system 312 in FIG. 6. That is, optical system 406, includes a window through which plasma emissions pass to reach a detection device and a system for monitoring the transmission quality through the window. The signal from the optical system 406 is fed into an optical diagnostic system 412, which may be a spectrometer, photomultiplier tube, CCD, etc., depending on the type of laser-excited diagnostic used (e.g., Rayleigh or Raman scattering or laser-induced fluorescence).

If required by the laser diagnostics, more ports can be used, such as for example, in coherent anti-Stokes Raman scattering, where two laser beams are directed across the chamber, and emissions are monitored through one port in the chamber 14, requiring 5 optical systems. The optical systems 402, 404, 406 can have different window sizes or window materials, for example, depending on the beam passed through each respective window of the optical systems 402, 404, 406.

Thus, the foregoing embodiments have been shown and described for the purpose of illustrating the functional and structural principles of this invention and are subject to change without departure from such principles. Therefore, this invention includes all modifications encompassed within the spirit and scope of the following claims.

What is claimed is:

1. A plasma processing system comprising:
   a chamber having an opening and containing a plasma processing region;
   a chuck, constructed and arranged to support a substrate within the chamber in the processing region;
   a plasma generator in communication with the chamber, the plasma generator being constructed and arranged to generate a plasma during a plasma process in the plasma processing region; and
   an optical system in communication with the chamber through the opening and having a window with one side facing the plasma processing region, the optical system being constructed and arranged to detect a plasma process condition through the window and a window transmission condition, wherein the window is configured to transmit a plasma optical emission formed into an incoming light beam by the optical system, the plasma processing condition being detected using the plasma optical emission, the optical system further comprising:
      a transmission input lens mounted on the side of the window facing the plasma processing region, and configured to transmit a transmission detection beam from a light source through the window;
      a transmission output lens mounted on the side of the window opposite the plasma processing region, and configured to receive the transmission detection beam for detecting the window transmission condition; and
      a shutter valve positioned between the transmission input lens and the window along the optical axis of the transmission detection beam, the shutter valve being configured to protect the transmission input lens, but not the window, from contamination by the plasma when closed, and allow passage of the transmission detection beam when open,
      wherein an optical axis of the transmission detection beam is positioned at an angle of less than 90° with respect to an optical axis of the incoming light beam and such that the transmission detection beam does not traverse the plasma processing region, so that interference of the transmission detection beam and the incoming light beam is minimized allowing detection of the window transmission condition during detection of the plasma optical emission.

2. The plasma processing system of claim 1, wherein the plasma generator comprises an upper electrode and a lower electrode spaced from the upper electrode, the upper and lower electrodes being constructed and arranged to generate the plasma therebetween when power is supplied thereto.

3. The plasma processing system of claim 1, wherein the plasma generator is an antenna.

4. The plasma processing system of claim 1, wherein the optical system has an open area formed in a central portion thereof, the open area being configured to receive the window.

5. The plasma processing system of claim 4, wherein the optical system comprises one or more optical baffles positioned in the open area, the one or more optical baffles being configured to reduce interference between the transmission detection beam and the incoming light beam.

6. The plasma processing system of claim 4, wherein the optical system comprises a restrictor element disposed between the chamber and the optical system.

7. The plasma processing system of claim 6, wherein the restrictor element is configured to create a higher pressure of purge gas passed through the open area due to reduced flow conductance.

8. The plasma processing system of claim 6, wherein the window is sealingly mounted to an end of the restrictor element.

9. The plasma processing system of claim 1, further comprising a gate valve positioned between the chamber and the optical system, the gate valve being constructed and arranged to substantially isolate the optical system from the chamber.

10. The plasma processing system of claim 1, wherein the optical system includes a spectrometer for detection of at least the plasma optical emission and a signal collection lens constructed and arranged to collect and direct the plasma optical emission to the spectrometer.

11. The plasma processing system of claim 1, wherein the optical system is configured to correct the detected plasma optical emission based on the window transmission condition.

12. The plasma processing system of claim 1, further comprising a laser configured to emit laser light into the plasma processing region.

13. The plasma processing system of claim 12, wherein the optical system receives laser-excited plasma emissions.

14. The plasma processing system of claim 13, wherein the optical system is positioned transverse to the laser light.

15. The plasma processing system of claim 13, wherein the optical system includes an optical diagnostic system.

16. The plasma processing system of claim 12, further comprising a laser beam dump, external to the plasma processing chamber, configured to collect laser light after the laser light has passed through the plasma processing chamber.

17. An optical system adapted for a plasma processing system having a chamber containing a plasma processing region, the optical system comprising:
   a signal collection portion having a window positioned therein with one side facing the plasma processing region, and being constructed and arranged to detect a plasma process condition through the window and a window transmission condition, wherein the window is configured to transmit a plasma optical emission formed into an incoming light beam by the optical system, the plasma processing condition being detected using the plasma optical emission;
   a transmission input lens mounted on the side of the window facing the plasma processing region, and configured to transmit a transmission detection beam from a light source through the window;
   a transmission output lens mounted on the side of the window opposite the plasma processing region, and configured to receive the transmission detection beam for detecting the window transmission condition; and
   a shutter valve positioned between the transmission input lens and the window along the optical axis of the transmission detection beam, the shutter valve being configured to protect the transmission input lens, but not the window, from contamination by the plasma when closed, and allow passage of the transmission detection beam when open,
   wherein an optical axis of the transmission detection beam is positioned at an angle of less than 90° with respect to an optical axis of the incoming light beam and such that the transmission detection beam does not traverse the plasma processing region, so that interference of the transmission detection beam and the incoming light beam is minimized allowing detection of the window transmission condition during detection of the plasma optical emission.

18. The optical system of claim 17, wherein the signal collection portion has an open area formed in a central portion thereof the open area being configured to receive the window.

19. The optical system of claim 18, wherein the optical system comprises one or more optical baffles positioned in the open area, the one or more optical baffles being configured to reduce interference between the transmission detection beam and the incoming light beam.

20. The optical system of claim 18, further comprising a mounting portion mounted to the plasma processing region and a restrictor element.

21. The optical system of claim 20, wherein the window is sealingly mounted to an end of the restrictor element.

22. The optical system of claim 20, wherein the restrictor element is configured to create a higher pressure of purge gas passed through the open area due to reduced flow conductance.

23. The optical system of claim 17, wherein the optical system includes a spectrometer for detection of at least the plasma optical emission and a signal collection lens constructed and arranged to collect and direct the plasma optical emission to the spectrometer.

24. The optical system of claim 23, wherein the optical system is configured to correct the detected plasma optical emission based on the window transmission condition.

* * * * *